(12) United States Patent
Kam et al.

(10) Patent No.: US 8,044,442 B2
(45) Date of Patent: Oct. 25, 2011

(54) METAL-INSULATOR-METAL (MIM) SWITCHING DEVICES

(75) Inventors: Hei Kam, Fremont, CA (US); Tsu-Jae King, Fremont, CA (US)

(73) Assignee: The Regents of the University of California, Oakland, CA (US)

( * ) Notice: Subject to any disclaimer, the term of this patent is extended or adjusted under 35 U.S.C. 154(b) by 294 days.

(21) Appl. No.: 12/261,865

(22) Filed: Oct. 30, 2008

(65) Prior Publication Data

US 2009/0128221 A1  May 21, 2009

Related U.S. Application Data

(63) Continuation of application No. PCT/US2007/067798, filed on Apr. 30, 2007.

(60) Provisional application No. 60/796,806, filed on May 1, 2006.

(51) Int. Cl.
*H01L 29/84* (2006.01)

(52) U.S. Cl. ... 257/254; 257/262; 257/369; 257/E29.17; 335/155; 361/233

(58) Field of Classification Search ............... 257/254, 257/E29.17, 262, 369; 335/155; 361/233
See application file for complete search history.

(56) References Cited

U.S. PATENT DOCUMENTS

| | | | |
|---|---|---|---|
| 5,578,976 A * | 11/1996 | Yao | 333/262 |
| 5,587,343 A | 12/1996 | Kano et al. | |
| 6,509,605 B1 | 1/2003 | Smith | |
| 6,548,841 B2 * | 4/2003 | Frazier et al. | 257/254 |
| 6,750,742 B2 * | 6/2004 | Kang et al. | 333/262 |
| 6,917,268 B2 * | 7/2005 | Deligianni et al. | 335/78 |
| 7,355,258 B2 * | 4/2008 | Valenzuela et al. | 257/415 |

OTHER PUBLICATIONS

Ionescu et al. Modeling and design of a low voltage SOI suspended gate MOSFET (SG-MOSFET) with a metal-over-gate architecture. Proc. Int'l Symposium on Quality Electronic Design, 2002, pp. 1-6.

* cited by examiner

*Primary Examiner* — Wael Fahmy
*Assistant Examiner* — John C Ingham
(74) *Attorney, Agent, or Firm* — John P. O'Banion

(57) ABSTRACT

A gated nano-electro-mechanical (NEM) switch employing metal-insulator-metal (MIM) technology and related devices and methods which can facilitate implementation of low-power, radiation-hardened, high-temperature electronic devices and circuits. In one example embodiment a gate electrode is configured as a cantilever beam whose free end is coupled to a MIM stack. The stack moves into bridging contact across a source and drain region when the applied gate voltage generates a sufficient electrostatic force to overcome the mechanical biasing of the cantilever beam. A second set of contacts can be added on the cantilever beam to form a complementary switching structure, or to a separate cantilever beam. The switching can be configured as non-volatile in response to stiction forces. NEM circuits provide a number of advantages within a variety of circuit types, including but not limited to: logic, memory, sleep circuits, pass circuits, and so forth.

19 Claims, 10 Drawing Sheets

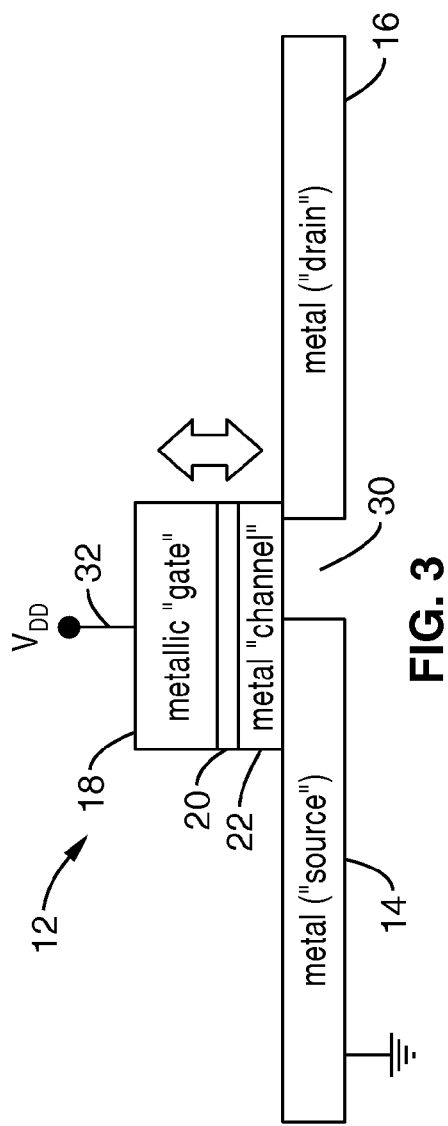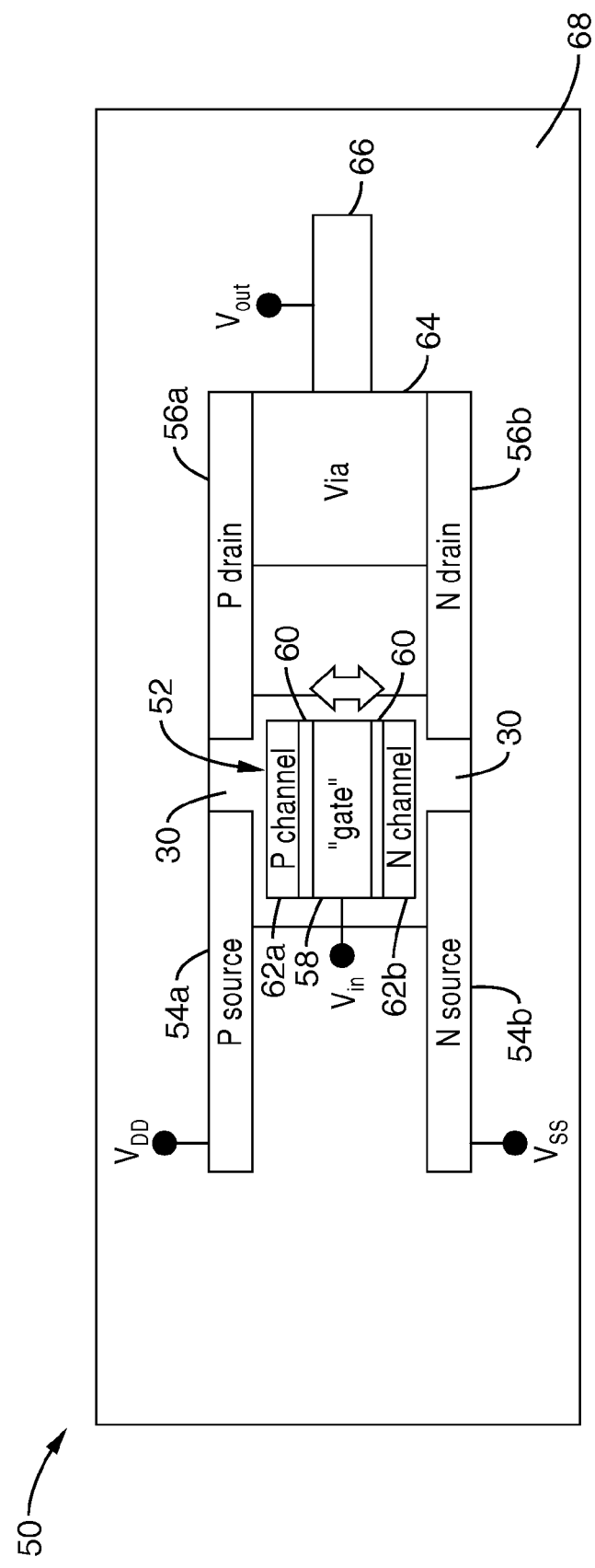

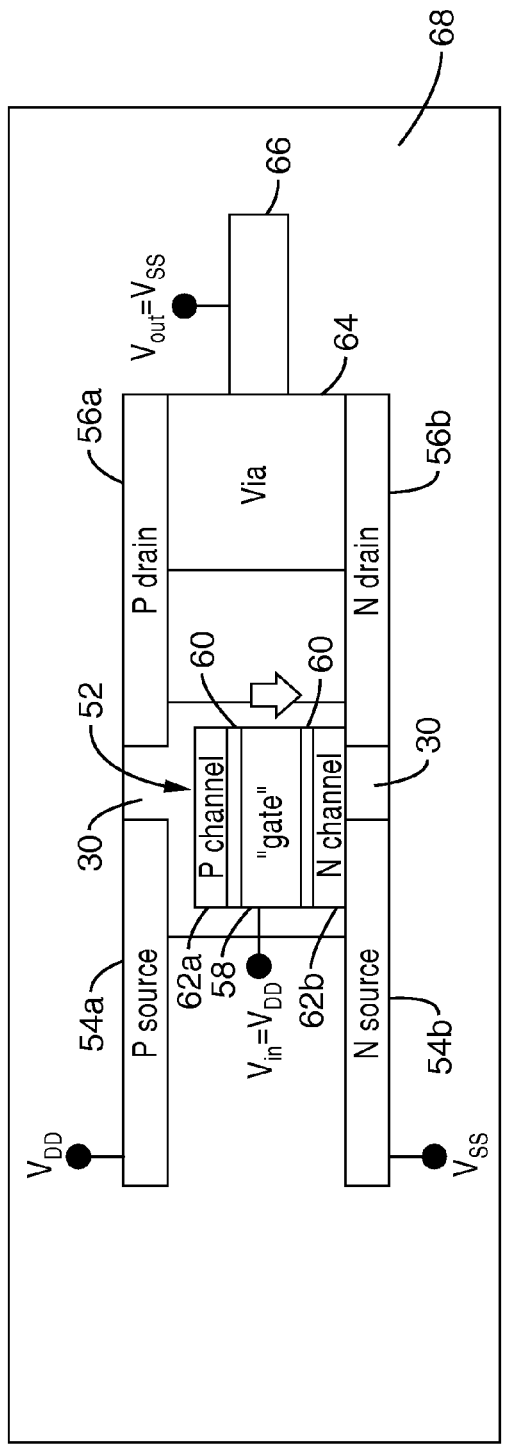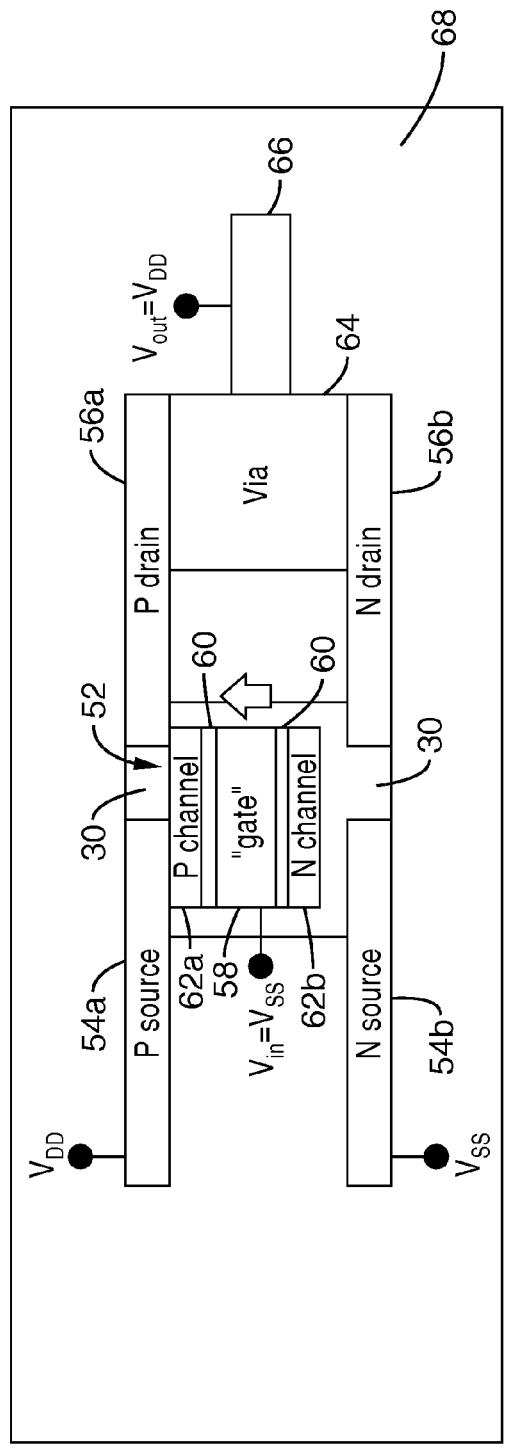

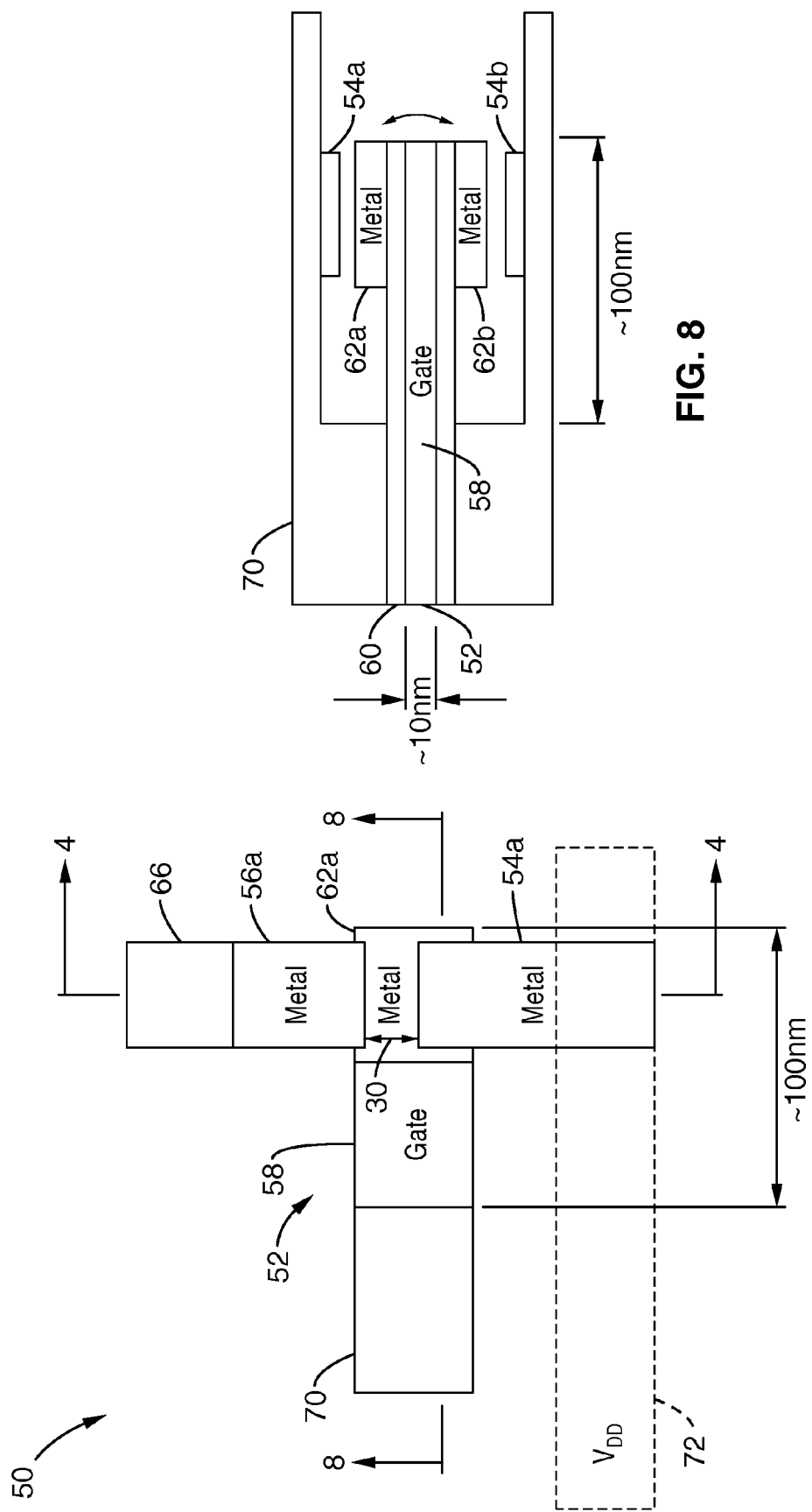

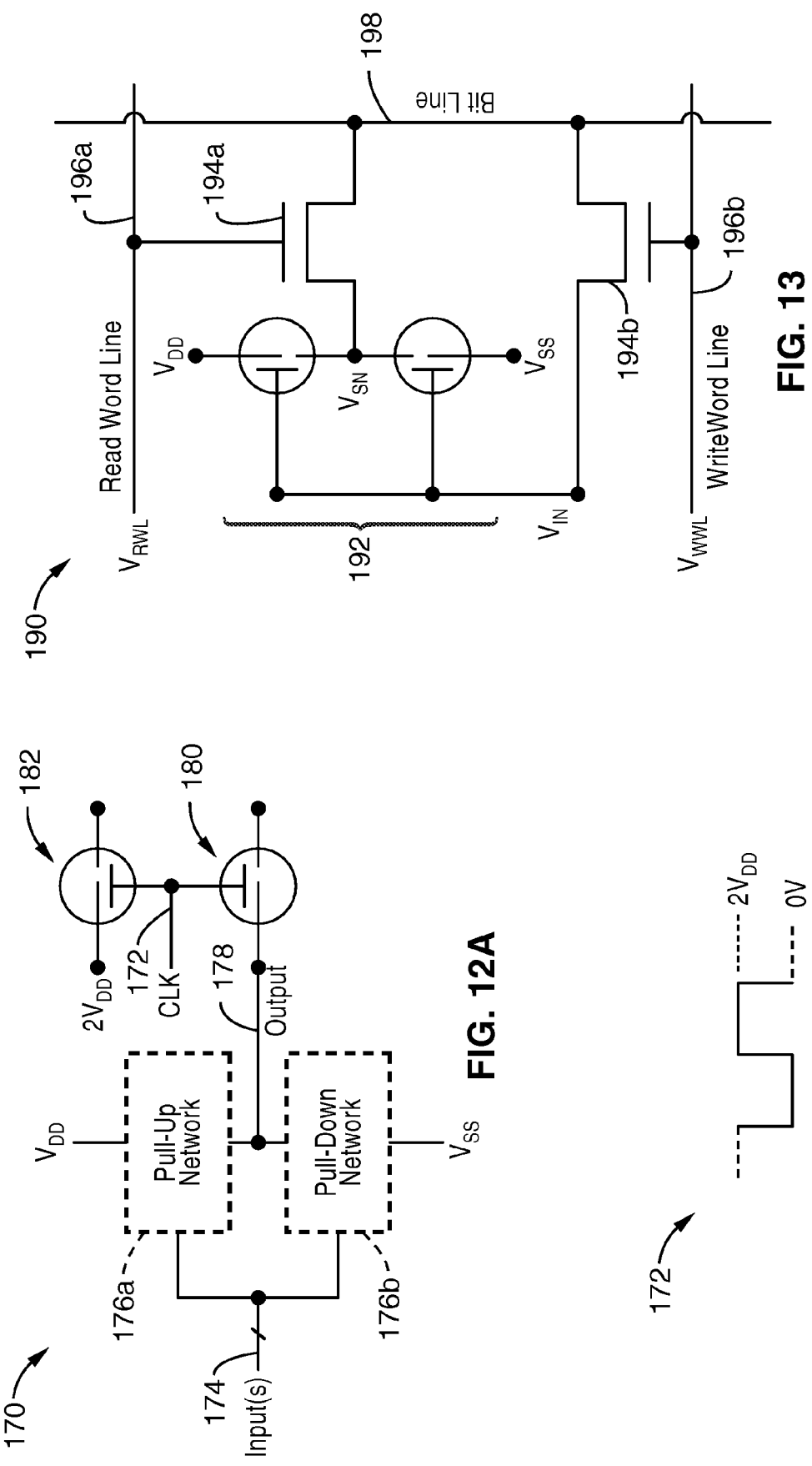

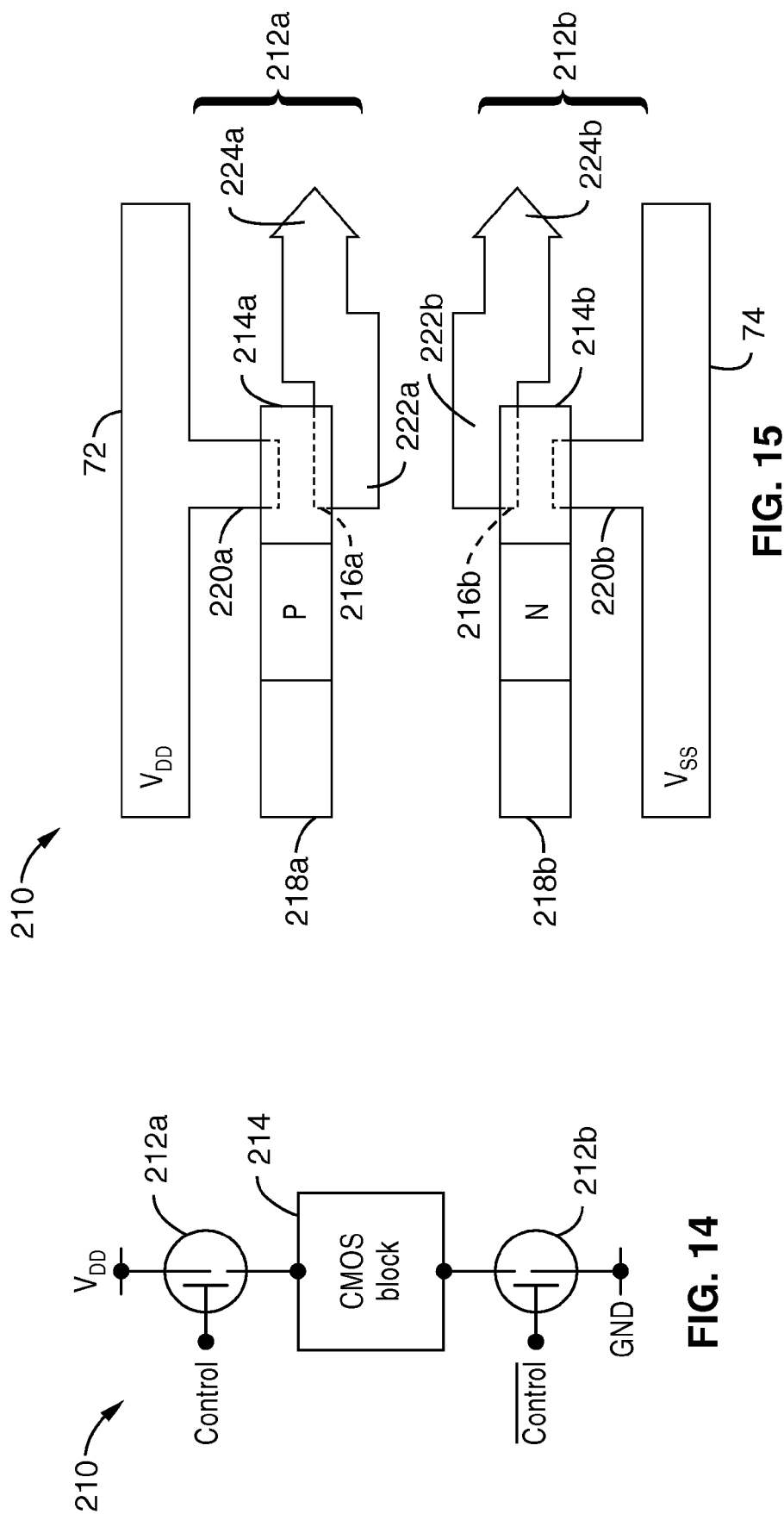

METAL-INSULATOR-METAL (MIM) SWITCHING DEVICES

CROSS-REFERENCE TO RELATED APPLICATIONS

This application claims priority from, and is a 35 U.S.C. §111(a) continuation of, co-pending PCT international application serial number PCT/US2007/067798, filed on Apr. 30, 2007, incorporated herein by reference in its entirety, which claims priority from U.S. provisional application Ser. No. 60/796,806 filed on May 1, 2006, incorporated herein by reference in its entirety.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

BACKGROUND OF THE INVENTION

1. Field of the Invention

This invention pertains generally to an electrical switching element, and more particularly to a gated nano-electro-mechanical switch utilized in place of conventional switching transistors within logic and memory circuits.

2. Description of Related Art

Power consumption has emerged as a major challenge for continued scaling of CMOS technology. In particular, static (leakage) power is an issue because it increases exponentially with reductions in gate length and gate-dielectric thickness. Dynamic power is difficult to reduce by scaling the supply voltage ($V_{DD}$), because of threshold voltage ($V_T$) variability and non-scalability due to fundamental thermal limits which dictate that leakage current increases exponentially with decreasing $V_T$.

In general, there exist four main areas to this scaling problem: (1) drain leakage which doubles with each successively smaller generation of CMOS; (2) attempts to ameliorate gate leakage necessitate utilizing advanced gate dielectric materials from which cost and process integration issues arise; (3) threshold voltage control and reduction issues arise with variability resulting in yield issues, and in which non-scalability arises in response to the thermal limit (kT/q) making supply-voltage ($V_{DD}$) scaling difficult; (4) performance gains as technology scales down are controverted by parasitic resistance and capacitance which seriously limit performance in nanoscale transistors.

Potential technological solutions to this challenge include alternative transistor structures (e.g., thin-body MOSFETs) and high-mobility semiconductor channel materials (e.g., Ge, GaAs). However, drain leakage due to quantum-mechanical tunneling and $V_T$ variability and non-scalability remain as issues for these approaches in the sub-10 nm gate-length regime. In addition, the formation of uniform ultra-thin or narrow films and fins present a number of manufacturing challenges. In addition, the use of high-mobility channel materials poses a myriad of process integration challenges while performance benefits over Si are not dramatic. Still further, none of these proposed solutions address challenges for radiation hardness and high-temperature operation.

Therefore, electronic switching methods and devices are needed which can dramatically lower power consumption, such as in digital logic and memory devices while providing radiation hardness.

BRIEF SUMMARY OF THE INVENTION

Apparatus and methods are taught for utilizing embodiments of a gated nano-electro-mechanical (NEM) switch in place of conventional switching transistors. These devices exhibit a number of advantages over conventional transistors including zero off-state drain leakage, excellent on-state conductance (e.g., limited only by metal-to-metal contacts), radiation hardness, and a wide operating temperature range. These devices and methods leverage nano-electro-mechanical system (NEMS) and micro-electro-mechanical systems (MEMs) technology in controlling the structures and nanometer-scale gaps.

At least one embodiment of the invention is a nano-electro-mechanical (NEM) switch apparatus comprising a layered stack and at least one electrode, wherein the layered stack is moveable between a first position apart from the electrode and a second position in contact with the electrode. In one embodiment, the layered stack includes a cantilever-beam, a dielectric layer on a surface of the beam, and a metallic layer on the dielectric layer electrically isolated from the cantilever beam. In response to movement against a biasing force the metallic layer contacts the electrode in the second position. In one embodiment, the layered stack is a metal-insulator-metal (MIM) structure.

The electrode preferably comprises a pair of electrodes, with a source electrode separated from a drain electrode by a gap which is bridged by a channel layer (e.g., metallic) within the stack that is moved into a contact position touching across both the source and drain regions. In one mode of the invention, a greater portion of the gate stack contacts the source electrode than the drain electrode.

At least one embodiment of the invention is a metal-insulator-metal (MIM) nano-electro-mechanical (NEM) switch apparatus comprising a cantilever-beam having first and second surfaces, a first dielectric layer on the first surface, a second dielectric layer on the second surface, a first metal layer on the first dielectric layer, a second metal layer on the second dielectric layer, a first electrode, and a second electrode. The cantilever-beam is movable between a first position where the first metal layer contacts the first electrode, a second position where the second metal layer contacts the second electrode, and a third position where the first metal layer and the second metal layer are spaced apart from the first and second electrodes, respectively.

At least one embodiment of the invention is exemplified as an apparatus, comprising: (a) at least one gate stack having layers comprising (i) a gate electrode, (ii) at least one channel layer; and (iii) a dielectric separating the gate electrode from the channel layer(s); (b) at least one pair of output electrodes comprising source and drain electrodes which are separated by a gap; and (c) means for biasing the gate stack(s) toward a first position in which a first channel layer is held in separation from a first pair of output electrodes; (d) wherein a first gate stack is configured for mechanical translation from the first position to a second position in which contact is established between the first channel layer and a first pair of output electrodes, with translation being responsive to electrostatic forces arising from the application of a first voltage to the gate electrode. The drive voltage is preferably applied between the gate electrode and a first source electrode (e.g., within at least one pair of output electrodes).

In one preferred implementation of the above, the means for biasing comprises a cantilever beam coupled between a non-movable anchor and the first gate stack. To simplify construction, the cantilever beam preferably forms the gate electrode of the gate stack, or stacks. To increase maximum operating speed, the volumetric region surrounding the gate stack(s) is preferably fully evacuated, partially evacuated, or filled with a low-pressure substantially non-reactive gas. In a preferred implementation, the channel layer(s) and the pair(s) of output electrodes comprise identical material, or alternatively, materials having approximately equal work functions. Contact is established between the first channel layer and the pair of output electrodes, with a larger portion of the first channel layer in contact with the source electrode than is in contact with the drain electrode. More preferably the contact ratio is on the order of at least twice as much of the channel layer making contact with the source electrode as makes contact with the drain electrode.

In one preferred implementation of the above NEM switch, the first and second gate stacks share a single common gate electrode. Multiple pairs of output electrodes can be utilized which each comprise at least one source electrode and one drain electrode. Multiple gate stacks can be configured to provide stability in either of two, or more, positional states. For example, a first and second gate stack which are mechanically movable between one position, in which the first channel layer of the first gate stack makes contact with the first pair of output electrodes, and another position in which a second channel layer of the second gate stack makes contact with the second pair of output electrodes. In this way the apparatus can switch between two positions in response to applied gate electrode voltage. Embodiments having complementary contact states, wherein electrostatic forces can be applied toward or away from either contact state, are particularly well-suited for beneficially utilizing stiction forces according to the invention. The contacts can be configured so that stiction forces arise between the channel and source electrodes which overcome mechanical biasing of the gate stack, thereby creating a non-volatile switching mechanism holding its state despite a loss of power.

At least one embodiment can be adapted with multiple movable gates which can be mechanically translated into contact with multiple pairs of electrodes. For example, a first gate stack and a second gate stack share a common gate electrode and are separately movable and separately biased by the means for biasing. The first gate stack moves between a first position in which a first channel layer contacts a first pair of output electrodes, and a second position in which the first channel layer is out of contact with the first pair of output electrodes. Similarly, the second channel layer of the second gate stack is in contact with the second pair of output electrodes when the first channel layer of the first gate stack is separated from the first pair of output electrodes. Accordingly, the second channel layer of the second gate stack is separated from the second pair of output electrodes when the first channel layer of the first gate stack is in contact with the first pair of output electrodes.

These embodiments can provide a number of advantages over conventional circuitry, such as over CMOS circuitry, the following given by way of example and not limitation. These NEM switches can be fabricated in a layer adjacent to a MOSFET device layer. Contact is established with a low on-state resistance in comparison to conventional CMOS devices. These circuits can supply sufficient current through the contact for driving a capacitive load of a size that would otherwise require a series of conventional CMOS devices to drive (e.g., 2-6 devices). The gate electrode (or at least one of the gates electrodes in a multigate device) has a lower gate capacitance than exhibited by conventional CMOS devices. The NEM switch can attain a fast switching time on the order of 100 ps, or more preferably at or less than 100 ps. The NEM switch can be fabricated on less chip real-estate than an equivalent conventional CMOS device, and in at least one embodiment it is scalable at or below approximately a 1 nm minimum feature size.

At least one embodiment of the invention is exemplified as an apparatus, comprising: (a) a first gate stack having layers comprising: (i) a first gate electrode, (ii) a first channel layer, and (iii) a dielectric separating the first gate electrode from the first channel layer; (b) a first pair of output electrodes comprising a first source electrode and a first drain electrode which are separated from one another by a gap; and (c) means for biasing the first gate stack toward a first position in which the first channel layer is held separated from the first pair of output electrodes; (d) wherein the first gate stack is mechanically translated from the first position into a second position in which contact is established by the first channel layer across the first source electrode and the first drain electrode in response to electrostatic forces arising from the application of a first voltage to the first gate electrode.

Another embodiment provides complementary switching by adding a second gate stack with a second channel layer, as well as a second pair of output electrodes having second source and second drain electrodes which are separated by a gap. The second gate stack is biased similarly to the first gate stack into a position with complementary closure state as said first gate stack. Specifically, the second channel layer is held in contact with the second pair of output electrodes when the first channel layer is held separated from the first pair of output electrodes. In the alternate position, the second channel layer is held separated from the second pair of output electrodes when the first channel layer is held in contact with the first pair of output electrodes. By way of example, this complementary form of NEM switching can operate within a variety of devices, such as selected from the group of circuit devices consisting of logic gates, pass gates, memory circuits, and so forth.

Another embodiment of complementary switching is configured to rely on stiction forces exhibited between the channels and their respective pairs of electrodes. The stiction force exceeds the mechanical restoration force of the spring (i.e., cantilever beam) comprising the biasing means. As a result of stiction, the channels are made positionally stable in response to channel contact with a pair of electrodes and without any need of device power.

At least one embodiment of the invention is exemplified as an apparatus, comprising: (a) a cantilever beam configured as a gate electrode; (b) a gate stack coupled to the cantilever beam having layers comprising: (i) a first and second channel layer, and (ii) a dielectric configured for electrically isolating the first and second channel layers from the cantilever beam; (c) a first and second pair of output electrodes, each pair of output electrodes comprising a source electrode and drain electrode; (d) wherein the gate stack is configured for mechanical translation of the first channel layer, under electrostatic force responsive to the application of a first gate voltage, into contact with the first pair of output electrodes, while the second channel layer is held separated from the second pair of output electrodes; (e) wherein the gate stack is configured for mechanical translation of the second channel layer, under electrostatic force responsive to the application of a second gate voltage, into contact with the second pair of output electrodes, while the first channel is held separated from the first pair of output electrodes; and (f) wherein the apparatus is configured for complementary switching in which either the first pair or the second pair of output electrodes is bridged by the respective first or the second channel layer.

At least one aspect of the above embodiment applies gate voltages (e.g., first and second) to a common gate electrode. Alternatively, the gate electrode may be split, to receive two separate signals, such as complementary signals.

At least one aspect of the above embodiment couples the source electrode within the first pair of output electrodes to a first power supply voltage, while the source electrode within the second pair of output electrodes is coupled to a second power supply voltage.

At least one embodiment of the invention is exemplified as an apparatus capable of retaining digital data, comprising: (a) a bi-stable NEM pair; a first transistor coupled between a bit-line and a common gate electrode of the bi-stable NEM pair, with a gate of the first transistor coupled to a write word-line; (b) a second transistor coupled between a bit-line and the interconnection of drain electrodes within the first and second pair of output electrodes, with a gate of the second transistor coupled to a read word-line; (c) wherein the transistors are configured for storing data from the bit-line in response to activating the write line, or reading back data onto the bit-line in response to activating the read line.

At least one embodiment of the invention is exemplified as an apparatus capable of switching electrical signals on a circuit, comprising: (a) a first movable gate, comprising (i) a first cantilever beam configured as a first gate electrode, (ii) a first channel layer, and (iii) a dielectric configured for electrically isolating the first channel layer from the first cantilever beam; (b) a second movable gate, comprising: (i) a second cantilever beam configured as a second gate electrode, (ii) a second channel layer, and (iii) a dielectric configured for electrically isolating the second channel layer from the second cantilever beam; (c) wherein the first gate electrode is connected to the second gate electrode forming a common gate electrode; (d) a first and second pair of output electrodes, each pair of output electrodes comprising a source electrode and drain electrode; and (e) wherein the first movable gate is configured for mechanical translation of the first channel layer, under electrostatic force responsive to the application of a first gate voltage, into contact with the first pair of output electrodes, while the second channel layer is held separated from the second pair of output electrodes; (f) wherein the second movable gate is configured for translation of the second channel layer, under electrostatic force responsive to the application of a second gate voltage, into contact with the second pair of output electrodes, while the first channel layer is held separated from the first pair of output electrodes; and (g) wherein the apparatus is configured for complementary switching in which either the first or second pair of output electrodes is bridged by a channel layer.

At least one embodiment of the invention is exemplified as an apparatus for supplying power to a circuit block, comprising: (a) a first movable gate, comprising: (i) a first cantilever beam configured as a first gate electrode, (ii) a first channel layer of P material, and (iii) a dielectric configured for electrically isolating the first channel layer from the first cantilever beam; (b) a second movable gate, comprising: (i) a second cantilever beam configured as a second gate electrode, (ii) a second channel layer of N material, and (iii) a dielectric configured for electrically isolating the second channel layer from the second cantilever beam; (c) wherein the first gate electrode is configured to receive a first control signal, and the second gate electrode is configured to receive an inverse of the first control signal; (d) a first pair of output electrodes comprising a source electrode of P material coupled to a $V_{DD}$ supply voltage, and a drain electrode of P material configured for supplying $V_{DD}$ power to a circuit block; (e) a second pair of output electrodes comprising a source electrode of N material coupled to a $V_{SS}$ supply voltage, and drain electrode of an N material configured for supplying $V_{SS}$ power to the circuit block; and (f) wherein the first and second channel layers are configured for mechanical translation into contact with the first and second pair of output electrodes, respectively, in response to electrostatic forces arising from the first control signal being switched into a first state. The apparatus is configured to supply power to the circuit block in response to the first state of the control signal, and to electrically isolate the circuit block in response to the second state of the control signal.

At least one embodiment of the invention is exemplified as a method of switching digital signals, comprising: (a) mechanically biasing a gate stack with a metal-insulator-metal (MIM) structure into a first position separated from a pair of electrodes comprising a source electrode and drain electrode; and (b) deflecting the gate stack responsive to electrostatic force arising in response to application of a gate voltage to mechanically translate the gate stack into a position in which a second metal layer of the gate stack establishes contact across (e.g., bridging) the source and drain electrodes. In one implementation, the mechanical biasing is provided in response to extending a cantilever beam coupled to the gate stack, wherein the cantilever beam exhibits spring restoration force in response to the extent of flexure as the gate stack moves toward the pair of output electrodes.

At least one embodiment of the invention is exemplified as a method of switching digital signals, comprising: (a) mechanically biasing a gate stack, having first and second metal-insulator-metal (MIM) structures, into a first position separated from both a first and second pair of output electrodes, each pair of output electrodes comprising a source electrode and drain electrode; and (b) deflecting the gate stack responsive to electrostatic force arising in response to application of a first voltage, to mechanically translate the gate stack into a second position in which the gate stack contacts the first pair of output electrodes, and is held away from the second pair of output electrodes; and (c) deflecting the gate stack responsive to electrostatic force arising in response to application of a second voltage, to mechanically translate the gate stack into a third position in which the gate stack contacts the second pair of output electrodes, and is held away from the first pair of output electrodes.

An aspect of the invention is to provide a nano-electromechanical (NEM) electronic switching device utilizing a movable gate electrode.

Another aspect of the invention is to provide a NEM switching device in which switching state changes in response to an electrostatic force arising from application of a sufficient voltage between a movable gate electrode and one or more source electrodes.

Another aspect of the invention is to provide a NEM switching device having a low on-state resistance.

Another aspect of the invention is to provide a NEM switching device which is capable of driving large capacitive loads.

Another aspect of the invention is to provide a NEM switching device exhibiting low gate capacitance.

Another aspect of the invention is to provide a NEM switching device which can attain switching times at, or less than, 100 ps.

Another aspect of the invention is to provide a NEM switching device which can be fabricated using less chip real-estate than CMOS devices.

Another aspect of the invention is to provide a NEM switching device which is scalable to ~1 nm minimum feature size, or less.

Another aspect of the invention is to provide a NEM switching device which is tolerant to process variation.

Another aspect of the invention is to provide a NEM switching device which is suitable for planar and/or 3-D integration.

Another aspect of the invention is to provide a NEM switching device which can be fabricated in a layer adjacent to a MOSFET layer.

Another aspect of the invention is to provide a NEM switching device which can be fabricated in the same well as MOSFET devices.

Another aspect of the invention is to provide a NEM switching device which is not subject to a loss of switching state when exposed to radiation.

Another aspect of the invention is to provide a NEM switching device which is not subject to increased leakage or a loss of switching state when subjected to high temperatures.

Another aspect of the invention is to provide a NEM switching device utilizing a metal-insulator-metal (MIM) gate stack.

Another aspect of the invention is to provide a NEM switching device in which a movable gate stack bridges across between a source and drain electrode (e.g., shorting them together) in response to a sufficient voltage being applied to said movable gate electrode.

Another aspect of the invention is to provide a NEM switching device wherein said source and drain electrodes are sufficiently separated to prevent leakage current.

Another aspect of the invention is to provide a NEM switching device in which the electrostatic force generated in response to applied gate voltage causes movement of said movable gate electrode in opposition to a biasing force.

Another aspect of the invention is to provide a NEM switching device in which the biasing force is supplied by a cantilever beam which must be deflected in order to effect movement of said movable gate electrode.

Another aspect of the invention is to provide a NEM switching device in which the gate stack contacts a larger portion of said source electrode than said drain electrode when it establishes bridging contact.

Another aspect of the invention is to provide a NEM switching device in which the switching state is non-volatile and thus the device remains in switching state when powered off.

Another aspect of the invention is to provide a NEM switching device in which non-volatility is obtained in response to hold-in forces, such as stiction, acting in opposition to the force of the biasing means.

Another aspect of the invention is to provide a NEM switching device in which one or more gate stacks coupled to a single movable gate electrode can bridge different source-drain electrodes, in response to applied gate voltage.

Another aspect of the invention is to provide a NEM switching device in which one or more gate stacks coupled to multiple movable gate electrodes can bridge different sets of source-drain electrodes, in response to applied gate voltage.

Another aspect of the invention is to provide a NEM switching device in which the switch can be activated with a gate to source potential of as little as one volt, or more preferably less than one volt.

Another aspect of the invention is to provide a NEM switching device in which a gate stack bridges two alternative pairs of source-drain electrodes in response to the application of different gate voltages.

Another aspect of the invention is to provide a NEM switching device having a first state in which a P-channel bridges a P doped set of electrodes, and a second state in which an N-channel bridges an N doped set of electrodes.

Another aspect of the invention is to provide a NEM switching device in which the channel, source and drain comprise a metal material, and more preferably the same metal material.

Another aspect of the invention is to provide a complementary NEM switching device in which a first and second set of source-drain contacts are alternately bridged respectively by first and second channel regions in response to different applied gate voltages.

Another aspect of the invention is to provide a complementary NEM switching device having two separate MIM stacks.

Another aspect of the invention is to provide a complementary NEM switching device in which said first and second set of source-drain contacts cannot be simultaneous bridged.

Another aspect of the invention is to provide logic circuits (i.e., Invert, NAND, NOR) constructed from complementary NEM switching devices.

Another aspect of the invention is to provide a complementary MIM switching device which can be utilized in forming any desired type of digital logic circuit, such as by replacing conventional CMOS transistor pairs with complementary MIM switch pairs.

Another aspect of the invention is to provide memory cells constructed from complementary NEM switching devices coupled to MOSFET access transistors.

Another aspect of the invention is to provide sleep circuits constructed from NEM switching devices.

Another aspect of the invention is to provide a NEM switching device utilizing a body electrode.

Another aspect of the invention is to provide a NEM switching device in which the actuation voltage is applied between the gate and body instead of between the gate and one of the source electrodes.

Another aspect of the invention is to provide a NEM switching device in which the body bias can be used for adjusting the gate voltage required for switching.

A still further aspect of the invention is to provide pass gates constructed from complementary NEM switching devices.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

FIG. 3 is a cross-section of a metal-insulator-metal (MIM) switch according to an aspect of the present invention, shown in an on state in response to application of a sufficient gate to source potential for overcoming a bias force.

FIG. 4 is a cross-section of a complementary metal-insulator-metal (MIM) inverter pair according to an embodiment of the present invention, shown in a non-activated state.

FIG. 5 is a cross-section of the complementary MIM inverter pair shown in FIG. 4, shown in a first switch state with an N channel bridging an N source and N drain.

FIG. 6 is a cross-section of the complementary MIM inverter pair shown in FIG. 4, shown in a second switch state with an P channel bridging an P source and P drain.

FIG. 7 is a plan view of a complementary metal-insulator-metal (MIM) inverter according to an aspect of the present invention, showing a layout of the inverter pair.

FIG. 8 is a cross-section of the MIM inverter of FIG. 7 as severed through 8-8 for viewing.

FIG. 12A is a schematic of clocking CMIM logic gates according to an aspect of the present invention.

FIG. 12B is a graph of a digital clock signal utilized in clocking the CMIM logic gates of FIG. 12A.

FIG. 13 is a schematic of a MIM based SRAM memory according to an embodiment of the present invention, showing data state access requiring only two additional transistors.

FIG. 14 is a schematic showing sleep transistors for controlling power application to circuit block according to an embodiment of the present invention.

FIG. 15 is a schematic of a sleep transistor layout according to an embodiment of the present invention, showing separate gate electrodes and drain electrodes.

DETAILED DESCRIPTION OF THE INVENTION

Referring more specifically to the drawings, for illustrative purposes the present invention is embodied in the apparatus generally shown in FIG. 1 through FIG. 19. It will be appreciated that the apparatus may vary as to configuration and as to details of the parts, and that the method may vary as to the specific steps and sequence, without departing from the basic concepts as disclosed herein.

The present invention generally comprises a novel nanoscale electro-mechanical (NEM) switch technology, which can achieve highly beneficial characteristics of very low on-state resistance and zero off-state leakage current, while exhibiting low parasitic capacitances, and reduced active power consumption.

NEM Device Structure.

Figure 1:
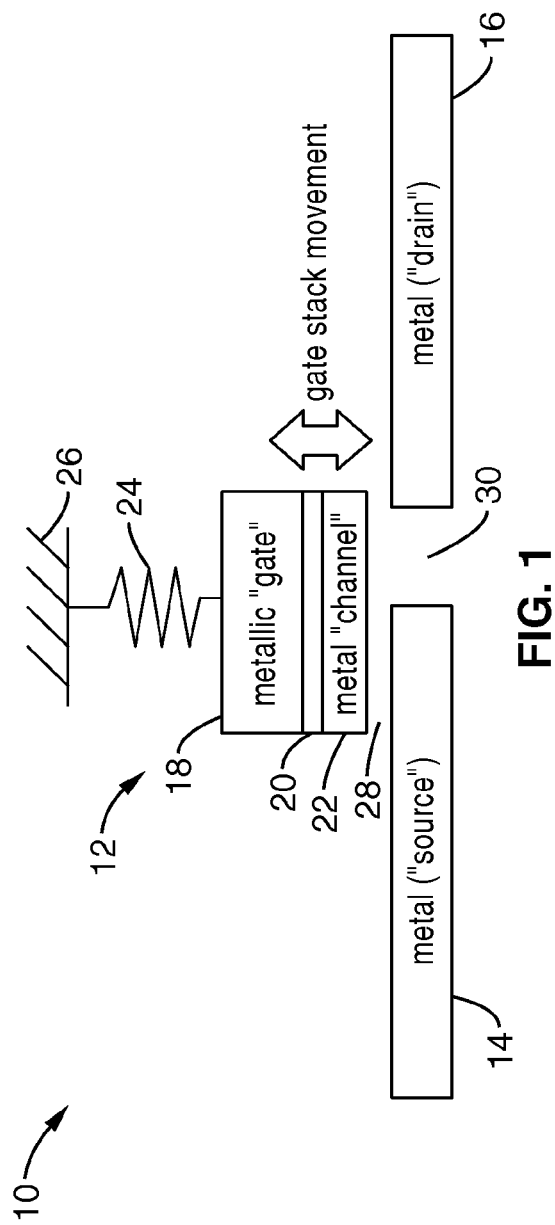
FIG. 1 is a cross-section of a metal-insulator-metal (MIM) switch according to an embodiment of the present invention, showing a gate and channel coupled on a movable platform for selectively bridging between a source and drain electrode.

FIG. 1 illustrates an example embodiment 10 of a metal-insulator-metal (MIM) switching device. A movable gate 12 is shown configured for selectively bridging between a source electrode 14 and drain electrode 16. The metals used for the source, channel, and drain electrodes are ideally the same, or those having approximately the same work functions, in order to avoid built-in electric fields. In at least one preferred embodiment, the area comprising the channel-to-source overlap exceeds the channel-to-drain overlap (i.e., more preferably exceeds it by a significant amount), so that the electrostatic force between the gate and source is far stronger than that which exists between the gate and drain, given the same potential difference.

The switch structure comprises a movable gate 12, such as a metal-insulator-metal (MIM) stack, proximally positioned for shorting together at least one source electrode 14 and at least one drain electrode 16. Source and drain electrodes are substantially co-planar and preferably configured wherein movement of the gate does not require a rotational component in order to short source electrode 14 and drain electrode 16, so that gate 12 simply moves down when establishing a connection across source and drain. By way of example and not limitation, the MIM stack comprises a first metal layer 18, a dielectric 20, and a second metal layer 22 forming a channel. The movable gate 12 is coupled by a biasing means 24 to an anchor 26, relative to which it is displaced toward the combination of source 14 and drain 16 leaving a gap 28 in an off-state and no gap when in the on-state. The movable gate 12 can be modeled mechanically as the mass of the movable gate 12, including all layers, coupled through a biasing means (e.g., spring member, cantilever beam, and so forth) 24 to anchor 26. Source electrode 14 and drain electrode 16 are separated by a gap 30 sufficient to prevent undesired leakage.

It should also be appreciated that in limited applications in which a transition is desired between a first and second level of current, as opposed to between current and no current, then gap 30 can be filled with a material having any desired resistance.

First metal layer 18 of movable gate 12 can be configured to function as both a gate electrode and a cantilever beam (e.g., biasing means), although these can be implemented separately as desired. Dielectric 20 is an insulation layer which electrically isolates the gate from the channel. The second metal layer 22 comprises a channel, which is brought into contact with the source and drain electrodes when a sufficiently high voltage difference (e.g., less than 1 Volt) is applied between the gate electrode and the source electrode.

In at least one preferred embodiment, the channel-to-source overlap is much larger than the channel-to-drain overlap, wherein the electrostatic force between the gate and source is substantially stronger than that between the gate and drain, given the same potential difference.

It should be appreciated that the gate can bridge between a single source and a single drain, or between a plurality of (e.g., segmented) sources and drains. Additionally, a single gate can be adapted with a plurality of channels 22, which for example can separately make contact between the source and drain, thus creating a multi-pole switching solution.

The source, channel, and drain electrodes can be made of any conductive material, preferably metals which are readily available in a back-end-of-line (BEOL) process. In one preferred embodiment the metals utilized for the source, channel and drain are the same, or have similar work functions, wherein inherent electric fields at the junctions of dissimilar metals are avoided. Metallic materials, heavily-doped semiconductor, carbon nanostructures (e.g., nanotubes), or combinations thereof, are particularly well suited for fabricating the electrodes. Metallic material(s) such as titanium nitride and amorphous aluminum alloys are attractive for minimizing surface forces and achieving high endurance, respectively. Conventional low-temperature-deposited dielectric material(s) can be used to electrically isolate the electrodes and mechanically anchor the gate electrode. The gaps are formed (to release the MIM stack) by selectively etching away sacrificial material such as molybdenum, or germanium which can be deposited by conventional low-pressure chemical vapor deposition at temperatures below 350° C. The selective etch can be a wet process (e.g., using heated $H_2O_2$ solution) or preferably a dry process (e.g., using xenon difluoride, $XeF_2$) to avoid stiction problems. Since the device structure does not require any semiconductor material, NEM relays can be fabricated directly over CMOS electronics, to minimize chip area.

MIM Device Operation.

Figure 2:
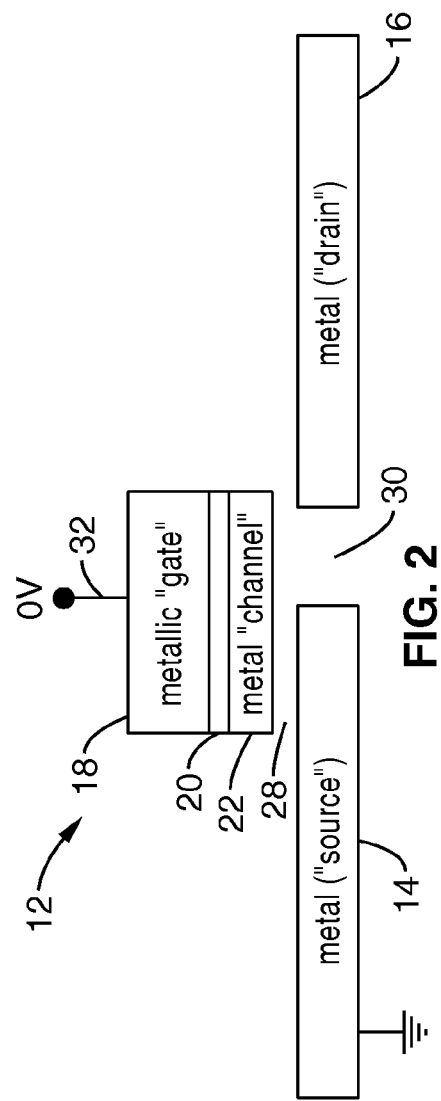
FIG. 2 is a cross-section of a metal-insulator-metal (MIM) switch according to an aspect of the present invention, shown in an off state in response to insufficient gate to source potential for activation.

FIG. 2 illustrates a MIM switching device in an off state, wherein channel 22 is physically separated from source electrode 14 and drain electrode 16. In the off-state shown, the channel is physically separated from the source and drain electrodes because the gate electrode 32 coupled to movable gate 12 is held at approximately the same potential (e.g., difference $<V_{pull-in}$) as the source, wherein insufficient electrostatic force exists between the gate electrode and the source electrode to cause the gate to pull into the source electrode. Since there is no electrical connection between the drain and the source, no current can flow between these two electrodes when the switch is in the off state. Even when the source and drain electrodes are very closely spaced (e.g., ~1 nm apart), the off-state leakage current remains zero. In other words, the NEM switch is scalable to ~1 nm minimum feature size, which is beyond the scaling limit of MOSFET device.

FIG. 3 illustrates a MIM switching device in an on state, wherein channel 22 is physically in contact between source electrode 14 and drain electrode 16. In response to electrostatic forces the movable gate has pulled in, wherein channel 22 makes a bridging contact between source electrode 14 and drain electrode 16, thus providing a low-resistance path for current flow. In at least one preferred embodiment, the on state is retained in response to surface forces (e.g., stiction forces) which hold the gate stack down in this conductive state. In this on state, the channel physically touches the source and drain electrodes, and since the channel is metallic on-state resistance is very low wherein that current can easily flow between the two electrodes.

Switching from the off state to the on state requires application of a sufficient voltage differential (e.g., a $V_{pull-in}$), this condition is met in the example shown by applying a voltage at or near supply voltage (e.g. $V_{DD}$) between the gate and source electrodes. It should be appreciated that $V_{pull-in}$ can be made to be any relative portion of the supply voltage, insofar as the structure is configured for that level of pull-in. For example, in some applications $V_{pull-in}$ may approximate $V_{DD}$, while in other applications $V_{pull-in}$ could be $½V_{DD}$, or some other desired relationship.

The channel potential is initially capacitively-coupled to the gate electrode potential, so that an electrostatic force exists between the channel and the source. If sufficient, this force pulls the MIM stack into contact with the source electrode against the biasing force of spring 24 (i.e., cantilever beam). As the channel 22 approaches the source electrode 14, its potential approaches that of source electrode 14. Once the channel 22 is in contact with the source electrode 14 and drain electrode 16, the drain potential quickly equilibrates with the source potential; the voltage difference between the gate and source electrodes is then fully sustained across the gate dielectric, which is sufficiently thick (~2 nm) to ensure negligible gate leakage. It should be appreciated that when the MIM device is in the off state, the potential on drain electrode 16 may be sufficiently close to the applied gate voltage, (or even higher) wherein no appreciable contribution is made to the electrostatic force required for closing. However, once channel 22 connects the source and drain, then the drain has a potential essentially equal to that of the source, and having the same difference as between the source and gate. Accordingly, this aspect of the invention also encourages retention in the on state, as does the stiction forces between channel 22 and respective surfaces on source 14 and drain 16 to which it is in contact.

It should be appreciated that the sub-threshold swing of a NEM switch can ideally be 0 mV/dec, so that $V_{DD}$ can be scaled more aggressively than for a MOSFET. For nanometer-scale gap dimensions, the voltage required to turn on the NEM switch can be well below 1 Volt.

It should also be appreciated that surface forces (e.g., Van Der Waals force) between the channel and source of a switch in the on state can be stronger (e.g., depending on design of these interfacing elements in relation to the biasing means) than the spring restoring force of the cantilever gate electrode, so that the position of the MIM gate stack will not change when the power is shut off. These adherence forces are commonly referred to as "stiction forces", causing the channel to stick and remain stuck to the electrodes until a force of sufficient strength counteracts the stiction. In other words, CMIM logic gates can be self-latching. It should be appreciated that the materials, as well as their texture and structure can be selected in order to arrive at a wide range of hold in levels (e.g., stiction) as the gate bridges the source and drain contacts. This feature is leveraged herein to simplify circuit designs, such as SRAM cells, for reducing cost as well as power consumption.

NEM Switching Performance Considerations.

The switching speed of the NEM switch is limited by the mechanical movement (deformation) of the cantilever-beam gate electrode and not by electrical charging/discharging of capacitances. For sub-100 nm lateral dimensions, the fundamental resonant frequency of the gate electrode can exceed 10 GHz, so that the switching speed can be less than 100 ps. On the other hand, the dynamic (switching) power of the NEM switch is dominated by electrical charging/discharging of capacitances, which will be much lower than for MOSFETs, since there are no p-n junctions. It will be appreciated that the power required to mechanically deform the gate electrode is relatively meager.

Complementary MIM for Digital Logic.

A complementary MIM structure is described which provides a number of benefits over conventional circuits. The following benefits are given by way of example and not limitation: (1) scalability to very low supply voltage ($V_{DD}$<0.5V) in response to nanometer-scale gaps and steep turn-on (0 mV/dec sub-threshold swing); (2) low capacitances, as there exist no p-n junctions and thus lower total (N-channel plus P-channel) gate capacitance than for CMOS technology, because of the vacuum gap, while speed can increase in response to smaller features; (3) non-volatile operation in response to surface forces which maintain gate stack position when power is shut off; (4) tolerance to process variation due to the perfectly complementary operation; and (5) suitability for 3-D integration.

FIG. 4 through FIG. 6 illustrate an example embodiment 50 of a complementary MIM inverter pair shown in various states. This device can be generally considered as a dual channel movable gate directed between a first and second set of electrodes (e.g., N channel source and drain electrodes, and P channel source and drain electrodes).

Referring to FIG. 4 a movable gate 52 is disposed between a first set of electrodes (e.g., P electrodes) including source electrode 54a and drain electrode 56a, and a second set of electrodes (e.g., N electrodes) including source electrode 54b and drain electrode 56b. It will be appreciated that in this configuration, only one of the set of electrodes, "N channel" or "P channel", can be bridged into an on state, wherein shorting between the supplies is not possible. Typically, the device is bi-stable, wherein the movable gate is either in contact with the first, or the second set of electrodes. The state shown in FIG. 4 would preferably only arise after manufacture, before the first time the device is activated.

The structure of movable gate 52 comprises a gate electrode 58 upon which is disposed a dielectric 60 and a first channel (e.g., P channel) 62a and second channel (e.g., N channel) 62b. In this embodiment electrostatic forces are utilized to actively pull the channel away from the source (and drain) to switch into off state. This force, together with the spring restoring force of the cantilever-beam gate, must be sufficient for overcoming the surface forces. It should be appreciated that complementary device operation operates automatically for the stacked pair of relays sharing a biasing means, such as a cantilever beam, as well as a gate electrode according to this configuration.

The structure is shown with a proximal end of the first and second sets of electrodes 54a, 54b coupled to a first and second potential, for example $V_{DD}$ and $V_{SS}$ as shown. The distal end of the first and second sets of electrodes 56a, 56b are coupled to a connection (e.g., via) 64 to an output 66, such as coupled to a subsequent input stage. The structure of NEM switch is shown surrounded by a dielectric 68.

FIG. 5 through FIG. 6 illustrate the CMIM inverter of FIG. 4 having been activated into an N-channel state in response to a first potential applied to gate electrode 58 for FIG. 5 and activated into a P-channel state in response to application of a second potential. When the input voltage $V_{in}$ goes to $V_{DD}$, the "N channel" is temporarily capacitively coupled to $V_{DD}$ so that there is an electrostatic force that attracts it to the "N source", causing the gate stack to be pulled down as shown in FIG. 5. With the gate stack pulled down, the electrostatic force between the P-channel (now capacitively coupled to $V_{DD}$) and P-drain (now at $V_{SS}$) is not sufficiently strong to overcome the surface forces holding the gate stack down due to the small channel-to-drain overlap. Accordingly, the N-MIM device is turned on and the P-MIM device is turned off, and the output voltage $V_{out}$ is discharged to $V_{SS}$. When $V_{in}$ goes to $V_{SS}$, the "P channel" is temporarily capacitively coupled to $V_{SS}$, so that there is an electrostatic force that attracts it to the "P source", causing it to be pulled up as shown in FIG. 6. With the gate stack pulled up, the electrostatic force between the N-channel (now capacitively coupled to $V_{SS}$) and N-drain (now at $V_{DD}$) is not sufficiently strong for overcoming the surface forces holding the gate stack up, due to the small channel-to-drain overlap. Accordingly, the P-MIM device is turned on and the N-MIM device is turned off, and $V_{out}$ is charged to $V_{DD}$.

By fabricating the NEM switch elements in pairs with a common gate electrode, as shown in FIG. 4-FIG. 6, perfectly complementary operation of "N channel" and "P channel" switches is assured to avoid any possibility of transient shorting between $V_{DD}$ and $V_{SS}$.

FIG. 7 through FIG. 8 illustrate by way of example embodiment 50 a CMIM stacked (non-planar) inverter implementation, as was previously shown in an end view in FIG. 4 through FIG. 6.

In FIG. 7 a plan view is shown with anchor region 70 from which a cantilever of movable gate 52 is coupled, the top side of which is joined P-channel 62a, shown beneath, but not connected to, a first set of electrodes with source electrode 54a and drain electrode 56a, and via region 66 connecting the drains at the output side of the CMIM device as an output node. A first conductive region 72 is a $V_{DD}$ line which is shown parallel to the anchor region 70 and cantilever, while connecting with source electrode 54a. It will be appreciated that a $V_{SS}$ line (not shown) is also positioned below $V_{DD}$ line 72, and is coupled to another source electrode 54b (not shown) on the opposite side of the movable gate structure. In this view, P-channel 62a is constrained to move orthogonal to the page (moving either up and out of the page, or into the page), in making contact with the first set of electrodes (shown here above the movable gate) and the second set of electrodes (not shown but which are below the movable gate).

In FIG. 8 is a side cross-section is shown viewed from severing lines 8-8 depicted in FIG. 7. The cantilever base of movable gate 52 is shown secured within dielectric material. Dielectric material is joined to the sides of the movable gate to insulate channels 62a, 62b from the metal of gate electrode 58. Source portions 54a, 54b of the first and second set of electrodes are seen to which channels 62a, 62b can make contact in response to deflection of the cantilever portion of movable gate 52.

Complementary MIM in a Planar Form.

In the previous embodiment of the CMIM inverter, the P-channel set of electrodes is stacked over a dielectric which is on top of the N-channel set of electrodes. This stacked arrangement substantially lessens the footprint area of the inverter, however, extra deposition and masking steps are necessary due to the vertical nature of the structure, wherein production costs are impacted. The planar configuration provides for implementation of the CMIM at lower cost due to the fewer number of fabrication steps.

Figure 10:
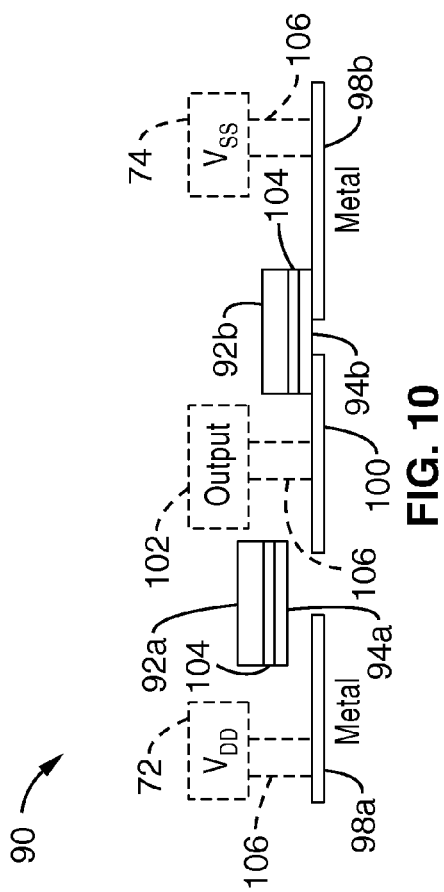
FIG. 10 is a side view of the planar CMIM inverter as shown in FIG. 9.
Figure 9:
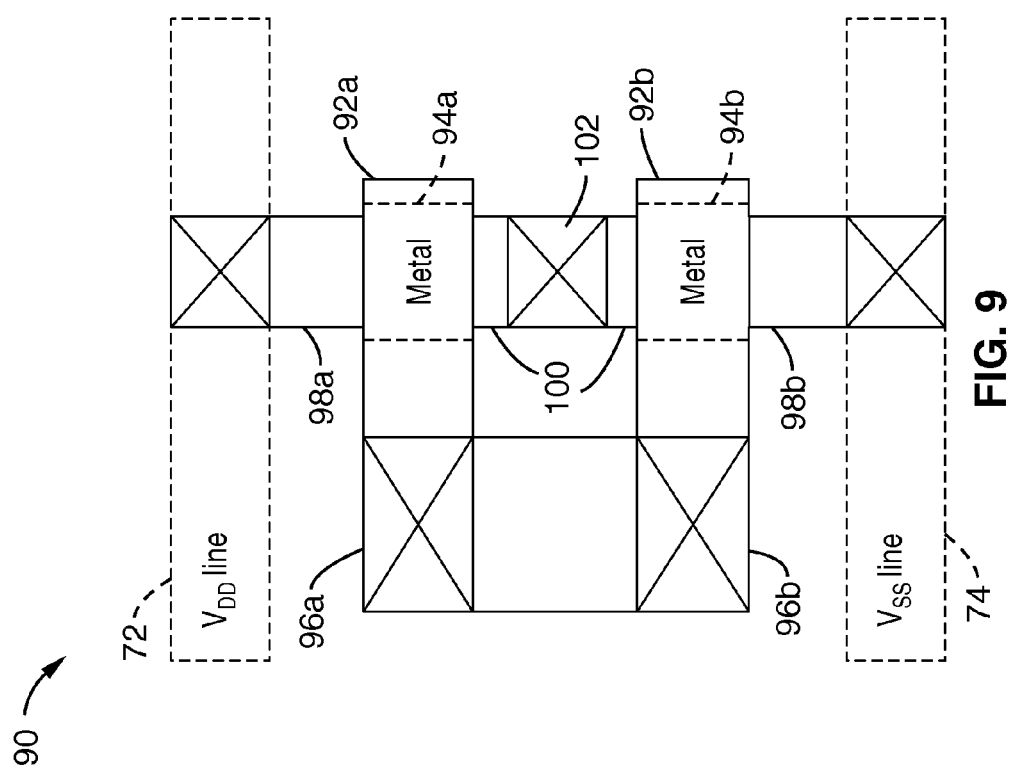
FIG. 9 is a plan view of a planar CMIM inverter according to another embodiment of the present invention.

FIG. 9 through FIG. 10 illustrate by way of example embodiment 90 a planar complementary MIM device. This embodiment performs inversion utilizing two separate movable gate portions, and thus lacks the assurance provided by the previous inverter embodiment which prevents shorting. In FIG. 9 the inverter device is shown in plan view with movable gates 92a, 92b, whose underside channels 94a, 94b bridge source 98a to drain 100, or source 98b to drain 100. Output via region 102 couples to drain region 100. The base of movable gates 92a, 92b is anchored at anchor regions 96a, 96b. Source 98a is coupled to a power supply $V_{DD}$ 72, while source 98b is coupled to a ground connection $V_{SS}$ 74. In FIG. 10 the gate structure is shown having a conductive gate layer 92a and a channel layer 94b between which a gate dielectric 104 is disposed. It will be noted that FIG. 10 depicts the device outputting $V_{SS}$ 74 in response to input of a signal toward $V_{DD}$ 72. By way of example, movable gates 92a, 92b are configured with metal regions coupled to cantilever beams.

Complementary MIM Based Logic.

It should be appreciated that any digital logic gate can be implemented by replacing conventional complementary MOS transistor pairs with the complementary MIM switch pairs (e.g., planar or non-planar) described herein.

Figure 11A:
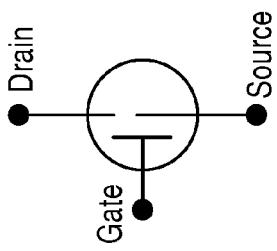
FIG. 11A is a schematic symbol for representing the MIM switching device according to an aspect of the present invention.
Figure 11D:
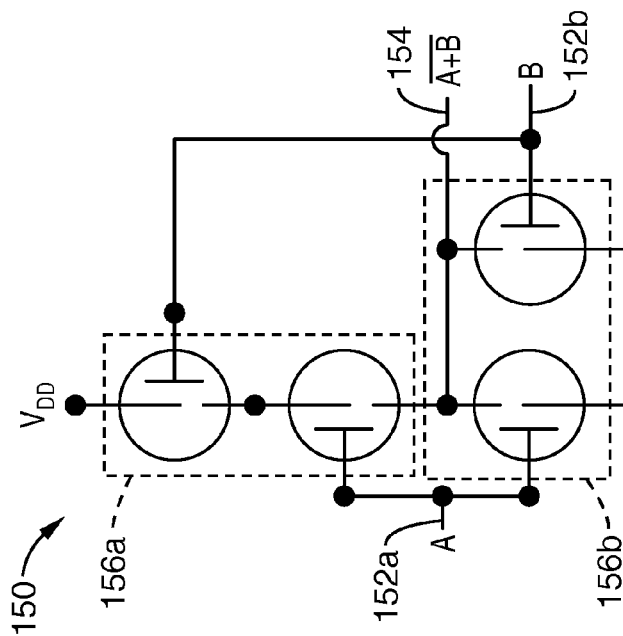
FIG. 11D is a schematic for representing a CMIM NOR circuit according to an embodiment of the present invention.
Figure 11C:
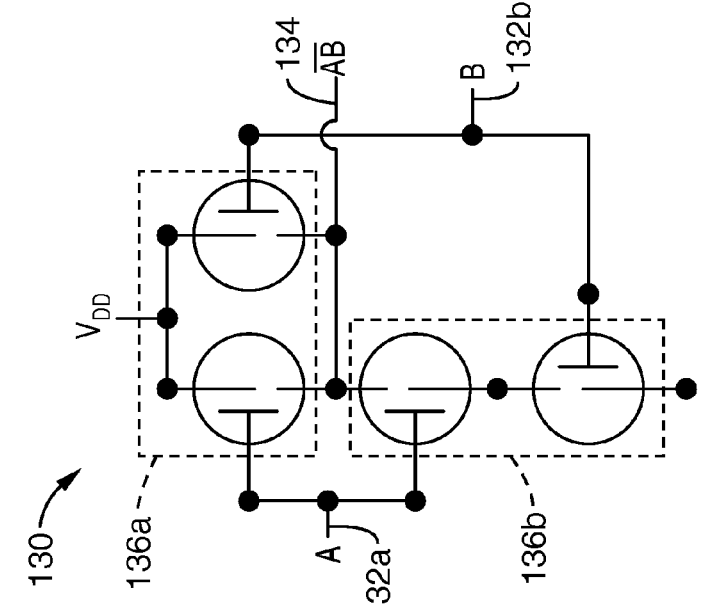
FIG. 11C is a schematic for representing a CMIM NAND circuit according to an embodiment of the present invention.
Figure 11B:
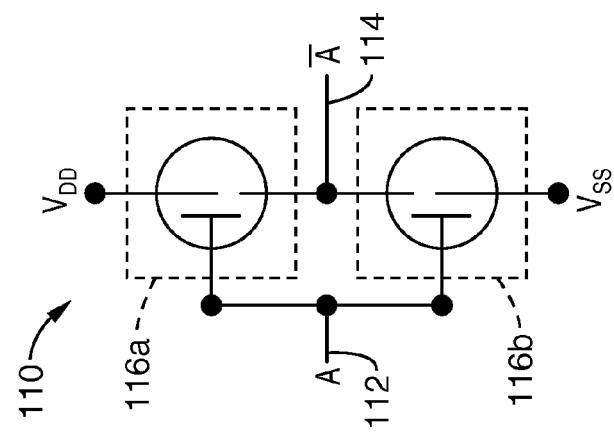
FIG. 11B is a schematic for representing a CMIM inverter circuit according to an aspect of the present invention.

FIG. 11A through FIG. 11D illustrate a number of schematics for CMIM logic according to the invention. In FIG. 11A a schematic symbol for a CMIM logic gate is shown by way of example. In FIG. 11B a CMIM inverter is shown with input 112 and output 114, comprising a complementary pair of devices (as shown in FIG. 11A) including a pull-up network 116a, and a pull-down network 116b. In FIG. 11C a CMIM NAND gate (Not AND) is shown with inputs 132a, 132b, and output 134. The NAND gates utilize pairs of MIM switch devices in the pull-up 136a and pull-down 136b networks for generating the NAND output (AB)'. In FIG. 11D a CMIM NOR gate (Not OR) is shown with inputs 152a, 152b, and output 154. The NOR gate utilizes pairs of MIM switch devices in a pull-up network 156a and pull-down network 156b, for generating a NOR output (A+B)'. It is readily seen from schematics FIG. 11B-11D that any desired form of logic circuitry can incorporate the technology, by way of example and not limitation: XOR, coincidence, latches, latched buffers, arithmetic units, multiplexers, demultiplexers, and so forth including incorporation within gate arrays, application specific circuitry, and processing elements.

FIG. 12A through FIG. 12B illustrate an example embodiment 170 of a pass-gate implemented with CMIM devices. FIG. 12A depicts one or more inputs 174 passing through a pull-up network 176a and a pull-down network 176b of a logic circuit, the output 178 from which is directed to a pass gate 180 whose gate receives a clock signal 172 of FIG. 12B. A second gate 182 can be configured for outputting to a different logic level, such as $2V_{DD}$ as shown, a complementary output or combinations thereof.

Complementary MIM Based SRAM Cell.

Compelling applications for CMIM switches include an embedded static memory (SRAM). It will be appreciated that if the CMIM device is configured for static active states, then the storage cells of a static RAM memory implemented with these devices will remain non-volatile without being subject to any appreciable current leakage.

FIG. 13 illustrates by way of example embodiment 190, a low-power SRAM cell utilizing a CMIM device pair 192 and requiring only two additional MOSFET devices 194a, 194b (e.g., two NMOS or two PMOS) for memory cell access. Another advantage is that this memory cell array can be fabricated within a single well. A read word-line ($V_{RWL}$) 196a, and write word-line ($V_{WWL}$) 196b are shown coupled to the gates of read and write access transistors 194a, 194b, whose sources are coupled to bit-line ($V_{BL}$) 198. CMIM pair 192 provides the data retention cell, the state of which according to this example is determined by input $V_{IN}$, whereupon after being set, the cell remains in that state even without power. On entering standby mode, when each transistor is turned off, $V_{IN}$ discharges to an intermediate level (between $V_{DD}$ and $V_{SS}$) wherein the electrostatic forces between gate and source electrodes are insufficient to change the position, and thus the state remains stable.

Complementary MIM Based Sleep Transistors.

FIG. 14 illustrates by way of example embodiment 210 a pair of MIM switching devices 212a, 212b being utilized as sleep transistors to cut the power being supplied to a cell or block 214, such as of low-$V_T$ circuitry, when it is in the standby ("sleep") mode. MIM sleep transistor pairs can be utilized in place of conventional CMOS sleep transistors. The sleep transistors have relaxed switching speed requirements (e.g., on the order of 1 nS). Due to their very low on-state resistance, the MIM devices do not subject the supply paths to the same level of $V_{DD}$ reduction which arises when utilizing CMOS devices of the same size. It should also be appreciated that, for a given level of allowable $V_{DD}$ reduction, smaller MIM devices can be utilized thus reducing the power necessary for switching between standby mode and active mode. In addition, the zero off-state current of the MIM devices guarantees that no power is consumed when in standby mode. Furthermore, since the MIM devices can be easily fabricated on top of CMOS circuitry, negligible additional layout area is required.

FIG. 15 illustrates by way of example, an embodiment 210 of a sleep transistor pair with MIM-based NEM switching devices 212a, 212b. Movable gates 214a, 214b, are shown upon whose underside are channels regions 216a, 216b for bridging source 220a to drain 222a, and at the same time source 220b to drain 222b. Drains 222a, 222b are connected, respectively, to separate outputs 224a, 224b. The base of movable gates 214a, 214b is anchored at anchor regions 218a, 218b. Source 220a is coupled to power supply $V_{DD}$ 72, while source 220b is coupled to ground connection $V_{SS}$ 74. Although not shown in this figure, the exemplified structure comprises metallic cantilevers 214a, 214b and conductive channel regions 216a, 216b between which a gate dielectric is disposed, thus forming a MIM structure.

NEM Device with Tunable Threshold Voltage.

NEM devices according to the present invention can be fabricated to provide a tunable threshold voltage. At least one embodiment of a NEM switch with a tunable threshold voltage incorporates a body electrode toward which the movable gate electrode is actuated. Two of the advantages of using a body electrode are that it: (1) allows for device switching in response to very small switching voltages; and (2) allows for dynamic adjustment of bias force to counteract non-ideal characteristics of a specific device, such as associated with surface forces and process-induced variations.

Figure 17:
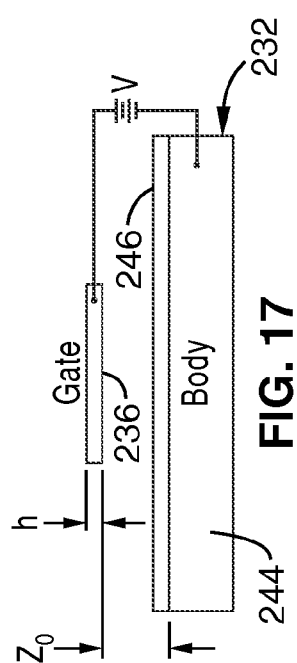
FIG. 17 is a cross-section of the body electrode NEM device of FIG. 16, showing gate with respect to the body.
Figure 18:
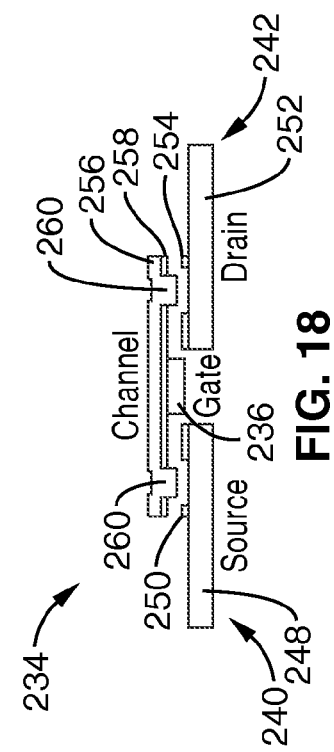
FIG. 18 is a cross-section of the body electrode NEM device of FIG. 16, showing the channel with respect to the source and drain sections.
Figure 16:
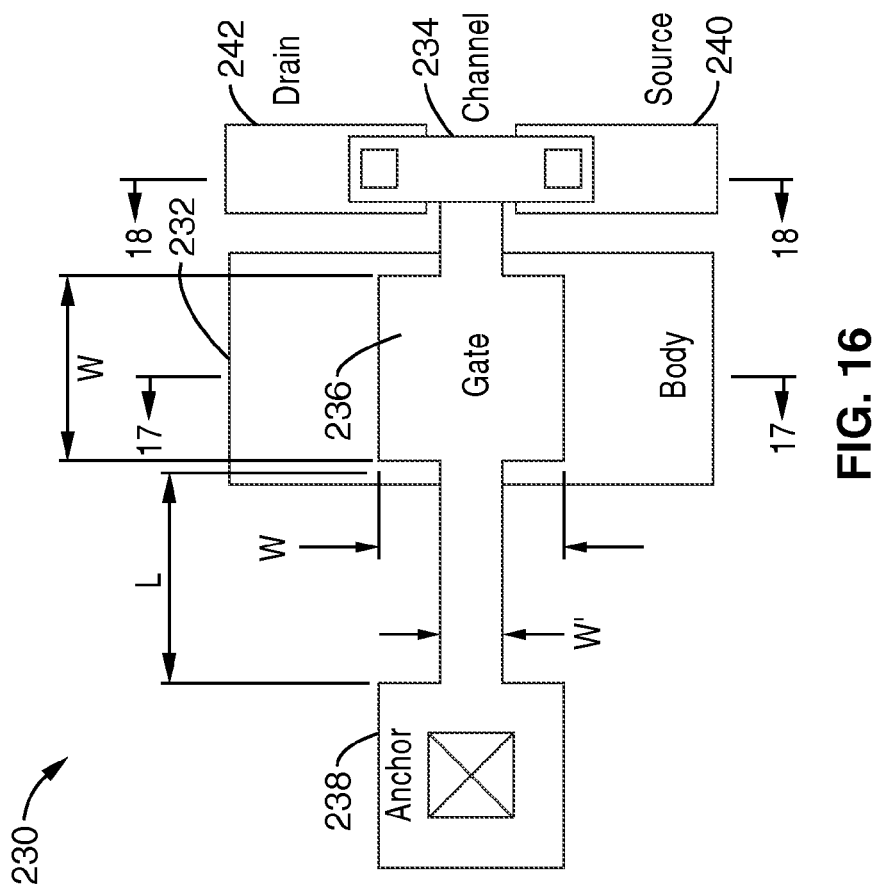
FIG. 16 is a plan view of a body electrode NEM device according to an embodiment of the present invention.

FIG. 16 through FIG. 18 illustrate an example embodiment 230 of a NEM device with a tunable threshold voltage. In FIG. 16 device 230 is shown with body electrode 232 configured for attracting a movable gate structure which is mechanically biased away from the body electrode, such as by a cantilever or similar bias structure configured for generating a spring restoring force in opposition to contact with the body electrode. In the example shown, the movable gate structure comprises a cantilevered gate electrode 236 with anchor 238 on a proximal end. A channel 234 is coupled to a distal end of cantilevered gate electrode 236 and configured for establishing contact with source 240 and drain 242. FIG. 17 depicts gate 236 suspended above body 232, which comprises a conductive material 244 which is preferably covered by at least one dielectric layer 246. Gate 236 is pulled down toward body 232 when electrostatic forces arise in response to a voltage applied between the gate and body, thus changing distance $Z_0$.

FIG. 18 illustrates an example of a channel electrode configuration with source electrode 240 comprising a conductive electrode 248 and dielectric 250. It is preferable that at least portions of conductive electrode 248 are covered by dielectric 250. Similarly, drain electrode 242 is shown with conductive electrode 252, at least a portion of which is covered by dielectric 254. Channel 234 is shown coupled to gate 236, and having a conductive portion 256 and dielectric 258 electrically insulating it from gate 236 and preferably also covering at least portions of the conductive portion 256.

Dimples 260 are shown extended toward both source 240 and drain 242 regions. When the switch is closed (on state), the gate electrode remains suspended above the body electrode and hence no gate current flows. By making the dimple gap between conductive portion 256 and conductive electrodes 248 and 252 small (e.g., less than about ⅓ of $Z_0$), the distance traversed by the gate electrode is limited, wherein undesirable hysteretic gap-closing behavior is avoided. The reason hysteretic gap-closing behavior is undesirable is because the hysteresis presents a lower limit for the voltage swing required to switch the relay on/off. The threshold voltage $V_T$ of the relay is then modulated directly by the body voltage $V_{body}$.

It will be appreciated that a body electrode may be utilized in differing configurations of NEM devices, such as in combination with the other embodiments described throughout the present invention, toward optimizing switch-based integrated circuits. One of the key characteristics of this aspect of the invention is that the drive (actuation) voltage is applied between the gate and the body electrode, rather than between the gate and one of the source electrodes. In other words, it is the voltage difference between the gate and the body that determines whether the switch is closed. One benefit of this design is that the body bias can be adjusted to ensure that the switch turns on at a particular gate-to-source voltage. This aspect is particularly well-suited for use in achieving complementary operation of "N-channel" and "P-channel" relays if they do not share the same cantilever gate (e.g., as shown in FIG. 9 and FIG. 10). A disadvantage to this configuration is that switch state is not retained when power is turned off.

Drive Comparison Between CMOS and CMIM.

Figure 19:
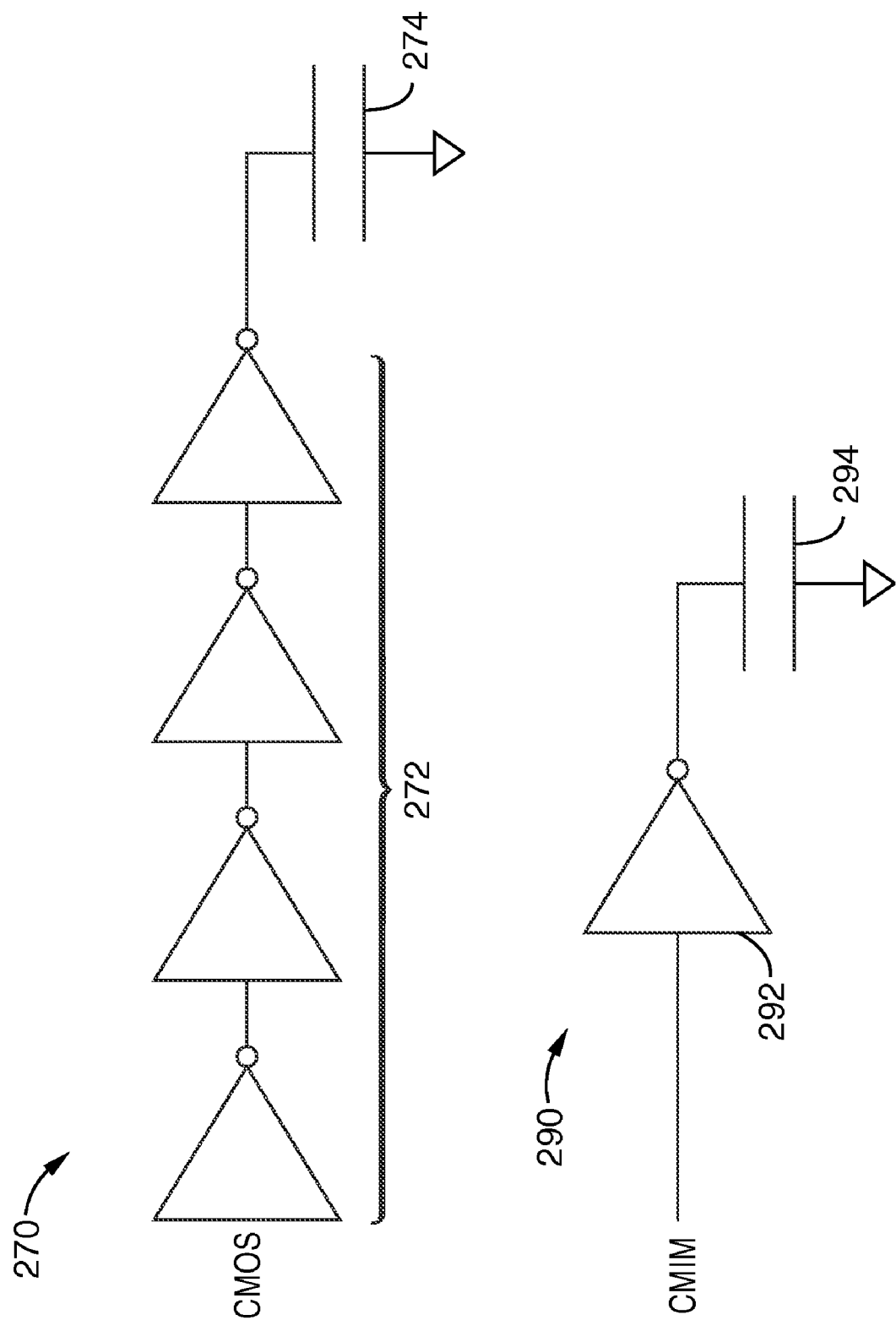
FIG. 19 is a schematic of drive circuits illustrating the difference between driving a large capacitive load with conventional CMOS devices, and driving the same load with CMIM devices according to an aspect of the present invention.

FIG. 19 illustrates a comparison between CMOS 270 and CMIM 290 embodiments with regard to driving of a large capacitive load. Multiple CMOS inverters 272 are shown coupled in series to drive a large capacitive load 274. The series connection is necessary as each MOSFET device has an on-state resistance on the order of kilo-ohms. However, embodiment 290 depicts a single CMIM device 292 capable of driving the same large capacitive load 274, therein reducing power consumption and layout area.

Characterization of CMIM Devices.

The gate delay of a CMIM device can be characterized as:

$$t_{delay} = t_{electrical} + t_{mechanical}$$

The value of $t_{electrical}$ represents a very small value, as it is approximately two orders of magnitude smaller than that of a CMOS device with the same W/L due to the lower on-state resistance and lower capacitance of the CMIM device. In the following analysis it is assumed that the volume within which the channel, or channels, are traversed by the movable gate move is fully evacuated, partially evacuated, or filled with a low-pressure substantially non-reactive gas, to reduce drag and thus speed gate movement. The value of $t_{mechanical} \gg t_{electrical}$ and is the primary limit on CMIM operating speed. However, this speed improves in response to miniaturization, as a consequence of reducing the mass of the moving mechanism.

The mechanical speed ($t_{mechanical}$) can be estimated by considering the resonant frequency (in radians per second) of the gate electrode, as follows:

$$\omega_0 = \sqrt{k/m}$$

According to the above relation, k is the spring constant and m is the mass of the gate. By way of example, in sub-100 nm lateral dimensions, beam resonant frequencies ($\omega/2\pi$) can exceed 10 GHz with $t_{mechanical}$ <100 pS being realizable. It should be appreciated that as the gate electrode size is reduced the switch operates more rapidly, which is in contrast to CMOS for which large gates (utilizing transistors with wider channels) result in faster speed. Accordingly, sizing of the overall CMIM devices won't yield faster gates, but the fastest gates comprise those which have minimum-sized gate electrodes. For large fan-in gates (e.g., a six input NAND gate), a CMIM device is faster than CMOS for the same layout area, considering the use of the same geometric rules.

Turning now to considering CMIM device dynamic power, it can be characterized as:

$$P = P_{mechanical} + P_{electrical}$$

The mechanical power $P_{mechanical}$ is the power required to actuate (i.e., sufficiently bend the biasing means toward contact) the gate electrode, which for example is related to bending energy $\frac{1}{2}kx^2$. By way of example embodiment, the poly-Si gate electrode is 0.25 μm wide (e.g., in the direction of current flow), 1 μm long and 40 nm thick, wherein k=81.92 N/m. If x=20 nm, then the bending energy required is about 16 fJ. It should be appreciated that this spring energy is recoverable, wherein the actual energy expenditure can be lowered. In addition, the value of $P_{mechanical}$ can be substantially reduced by scaling down air-gap thickness x.

The electrical power, $P_{electrical}$, requirement for this example is approximately 30.46 fJ, assuming that $V_T = \frac{1}{2} V_{DD}$. If $V_T$ is closer to $V_{DD}$ then $P_{electrical}$ will be lower, such as about 15 fJ, which is lower than $CV_{DD}^2$ for 0.25 μm CMOS which results in power of 37.5 fJ in response to the lower air-gap capacitance.

Radiation Hardness and Thermal Robustness.

It shall be appreciated that the NEM device according to the present invention provides switching without the use of semiconductor pn junctions, wherein no current flows in response to radiation-generated carriers, specifically electrons and holes. In contrast to this, within CMOS devices unwanted "spikes" of current can flow in reverse-biased pn junctions, causing upsets in device operation, such as unwanted changes in logic state for the cells within a device. It should also be appreciated that gate dielectric thickness on a NEM device can made thicker than on a comparable CMOS device, toward minimizing issues with charging due to ionizing radiation.

The use of the NEM devices also provides a number of thermal advantages. One important aspect of thermal robustness, is that the off-state current for a mechanical switch is always zero, whereas it depends exponentially on temperature in a MOSFET.

CONCLUSIONS

A number of nano-electro-mechanical (NEM) switches are taught herein, which utilize a movable gate, such as a metal-insulator-metal (MIM) structure, for controlling current flow between source and drain regions. These devices provide a number of advantages over conventional circuitry, such as CMOS circuits. It will be appreciated by one of ordinary skill in the art that the embodiments described can be combined in any desired combination, while numerous variation can be introduced into these embodiments and teachings without departing from the present invention. A mechanical position biasing means is described as a cantilever beam secured on a first end, and free to move on a second end, upon which is joined at least one channel configured for making mechanical contact to establish conductivity between a source electrode and a drain electrode. The biasing means can be implemented utilizing other structures including a cantilever beam secured on two ends and free to move in the middle, upon which is joined at least one channel configured for making mechanical contact to establish conductivity between a source electrode and a drain electrode. Other structures aside from cantilever structures, which are capable of supplying a mechanical biasing force, can also be used. When establishing an electrical connection between source and drain, the mechanical biasing force is to be overcome by a sufficient electrostatic force that arises in response to applied gate voltage, wherein the gate stack moves to establish electrical contacts. The channel element of the gate stack is configured for bridging between the source and drain regions, and is preferably a metallic material. The gate stack is preferably a MIM structure, and may be adapted to have any desired number of layers (1 to n), insofar as the channel is electrically isolated from the gate electrode. Examples of select logic circuits are exemplified, however, it will be appreciated that MIM switching devices, and more particularly complementary MIM devices, according to the present invention can be utilized for creating any desired form of logic element, or circuit block, without departing from the present invention.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. An apparatus, comprising:
   (a) a cantilever beam configured as a gate electrode;
   (b) a gate stack coupled to said cantilever beam having layers comprising:
      (i) a first and second channel layer; and
      (ii) a dielectric configured for electrically isolating said first and second channel layers from said cantilever beam;
   (c) a first and second pair of output electrodes, each pair of output electrodes comprising a source electrode and drain electrode;
   (d) wherein said gate stack is configured for mechanical translation of said first channel layer, under electrostatic force responsive to the application of a first gate voltage, into contact with said first pair of output electrodes, while said second channel layer is held separated from said second pair of output electrodes;
   (e) wherein said gate stack is configured for mechanical translation of said second channel layer, under electrostatic force responsive to the application of a second gate voltage, into contact with said second pair of output electrodes, while said first channel is held separated from said first pair of output electrodes; and
   (f) wherein said apparatus is configured for complementary switching in which either said first pair or said second pair of output electrodes is bridged by said first or said second channel layer;
   (g) wherein a stiction force arises in response to establishing contacts with said first and second channel layers, said stiction force exceeding the mechanical biasing force supplied by said means for biasing; and
   (h) wherein disconnection of said contact requires application of an opposing electrostatic force which overcomes said stiction force;
   (i) a first transistor coupled between a bit-line and said gate electrode in common with said first and second channel layers, with a gate of said first transistor coupled to a write word-line; and
   (j) a second transistor coupled between a bit-line and the interconnection of drain electrodes within said first and second pair of output electrodes, with a gate of said second transistor coupled to a read word-line;
   (k) wherein said transistors are configured for storing data from the bit-line in response to activating the write word line, or reading back data onto the bit-line in response to activating the read word line.

2. An apparatus as recited in claim 1:
   wherein said first and second gate voltages are applied to said gate electrode;
   wherein the source electrode within said first pair of output electrodes is coupled to a first power supply voltage; and
   wherein the source electrode within said second pair of output electrodes is coupled to a second power supply voltage.

3. An apparatus as recited in claim 1:
   wherein a proximal end of said cantilever beam is fixedly anchored in said apparatus; and
   wherein said first and second channel layer are attached to a distal end of said cantilever beam which moves in response to flexure of said cantilever beam.

4. An apparatus as recited in claim 1, wherein a volume surrounding said gate stack is fully evacuated, partially evacuated, or filled with a low-pressure substantially non-reactive gas.

5. An apparatus as recited in claim 1, wherein said first and second channel layers, and said first and second pair of output electrodes, comprise an identical material, or materials having approximately equal work functions.

6. An apparatus as recited in claim 1, wherein a larger portion of said first and second channel layer makes contact with said source electrodes of said first and second pairs of electrodes, than that which makes contact with said drain electrodes of said first and second pairs of electrodes.

7. An apparatus as recited in claim 1, wherein said apparatus performs said complementary switching within devices selected from the group of circuit devices consisting of logic gates, pass gates, and memory circuits.

8. An apparatus for supplying power to a circuit block, comprising:
   (a) a first movable gate, comprising:
      (i) a first cantilever beam configured as a first gate electrode;

(ii) a first channel layer of P material; and
(iii) a dielectric configured for electrically isolating said first channel layer from said first cantilever beam;

(b) a second movable gate, comprising:
(i) a second cantilever beam configured as a second gate electrode;
(ii) a second channel layer of N material; and
(iii) a dielectric configured for electrically isolating said second channel layer from said second cantilever beam;

(c) wherein said first gate electrode is configured to receive a first control signal, and said second gate electrode is configured to receive an inverse of said first control signal;

(d) a first pair of output electrodes comprising a source electrode of P material coupled to a $V_{DD}$ supply voltage, and a drain electrode of P material configured for supplying $V_{DD}$ power to a circuit block;

(e) a second pair of output electrodes comprising a source electrode of N material coupled to a $V_{SS}$ supply voltage, and drain electrode of an N material configured for supplying $V_{SS}$ power to the circuit block; and (f) wherein said first and second channel layers are configured for mechanical translation into contact with said first and second pair of output electrodes, respectively, in response to electrostatic forces arising from said first control signal being switched into a first state;

whereby the apparatus is configured to supply power to the circuit block in response to said first state of said control signal, and to electrically isolate the circuit block in response to said second state of said control signal.

9. An apparatus, comprising:
(a) a gate electrode;
(b) means for mechanical biasing, which is coupled to said gate electrode;
(c) a gate stack coupled to said means for mechanical biasing having layers comprising:
(i) a first and second channel layer; and
(ii) a dielectric configured for electrically isolating said first and second channel layers from said means for mechanical biasing;
(d) a first and second pair of output electrodes, each pair of output electrodes comprising a source electrode and drain electrode;
(e) wherein said gate stack is configured for mechanical translation of said first channel layer, under electrostatic force responsive to the application of a first gate voltage, into contact with said first pair of output electrodes, while said second channel layer is held separated from said second pair of output electrodes;
(f) wherein said gate stack is configured for mechanical translation of said second channel layer, under electrostatic force responsive to the application of a second gate voltage, into contact with said second pair of output electrodes, while said first channel is held separated from said first pair of output electrodes;
(g) wherein said apparatus is configured for complementary switching in which either said first pair or said second pair of output electrodes is bridged by said first or said second channel layer;
(h) wherein a stiction force arises in response to establishing contacts with said first and second channel layers, said stiction force exceeding the mechanical biasing force supplied by said means for biasing;
(i) wherein disconnection of said contact requires application of an opposing electrostatic force which overcomes said stiction force;
(j) a first transistor coupled between a bit-line and said gate electrode in common with said first and second channel layers, with a gate of said first transistor coupled to a write word-line; and
(k) a second transistor coupled between a bit-line and the interconnection of drain electrodes within said first and second pair of output electrodes, with a gate of said second transistor coupled to a read word-line;
(l) wherein said transistors are configured for storing data from the bit-line in response to activating the write word line, or reading back data onto the bit-line in response to activating the read word line.

10. An apparatus as recited in claim 9, wherein said means for mechanical biasing comprises a cantilever beam coupled between a non-movable anchor within said apparatus and said gate stack.

11. An apparatus as recited in claim 10, wherein said cantilever beam forms the gate electrode of said at least one gate stack.

12. An apparatus as recited in claim 9:
wherein a proximal end of said cantilever beam is fixedly anchored in said apparatus; and
wherein said first and second channel layer are attached to a distal end of said cantilever beam which moves in response to flexure of said cantilever beam.

13. An apparatus as recited in claim 9, wherein said first and second channel layers, and said first and second pair of output electrodes, comprise an identical material, or materials having approximately equal work functions.

14. An apparatus as recited in claim 9, wherein a larger portion of said first and second channel layer makes contact with said source electrodes of said first and second pairs of electrodes, than that which makes contact with said drain electrodes of said first and second pairs of electrodes.

15. An apparatus as recited in claim 9, wherein a volumetric region surrounding said gate stack is fully evacuated, partially evacuated, or filled with a low-pressure substantially non-reactive gas.

16. An apparatus for supplying power to a circuit block, comprising:
(a) a first movable gate, comprising:
(i) a first means for mechanical biasing configured as a first gate electrode;
(ii) a first channel layer of P material; and
(iii) a dielectric configured for electrically isolating said first channel layer from said first means for mechanical biasing;
(b) a second movable gate, comprising:
(i) a second means for mechanical biasing configured as a second gate electrode;
(ii) a second channel layer of N material; and
(iii) a dielectric configured for electrically isolating said second channel layer from said second means for mechanical biasing;
(c) wherein said first gate electrode is configured to receive a first control signal, and said second gate electrode is configured to receive an inverse of said first control signal;
(d) a first pair of output electrodes comprising a source electrode of P material coupled to a $V_{DD}$ supply voltage, and a drain electrode of P material configured for supplying $V_{DD}$ power to a circuit block;
(e) a second pair of output electrodes comprising a source electrode of N material coupled to a $V_{SS}$ supply voltage, and drain electrode of an N material configured for supplying $V_{SS}$ power to the circuit block; and (f) wherein said first and second channel layers are configured for mechanical translation into contact with said first and second pair of output electrodes, respectively, in response to electrostatic forces arising from said first control signal being switched into a first state;

whereby the apparatus is configured to supply power to the circuit block in response to said first state of said control signal, and to electrically isolate the circuit block in response to said second state of said control signal.

17. An apparatus as recited in claim 16, wherein said first means for mechanical biasing and said second means for mechanical biasing comprises a cantilever beam attached to non-movable anchors.

18. An apparatus as recited in claim 16, wherein a volumetric region, surrounding said at least one of said first movable gate and/or said second movable gate, is fully evacuated, partially evacuated, or filled with a low-pressure substantially non-reactive gas.

19. An apparatus as recited in claim 16, wherein the contact between said first channel layer and said first pair of output electrodes, and said second channel layer and said second pair of output electrodes, is established with a larger portion of each respective channel layer in contact with its respective source electrode than with its respective drain electrode.

* * * * *